United States Patent [19]

Hall

[11] Patent Number: 5,119,160

[45] Date of Patent: Jun. 2, 1992

[54] CLOCKED CBICMOS INTEGRATED TRANSISTOR STRUCTURE

[76] Inventor: John H. Hall, 3169 Payne, Apt. #50, San Jose, Calif. 95117

[21] Appl. No.: 614,938

[22] Filed: Nov. 19, 1990

[51] Int. Cl.⁵ ............................................. H01L 27/02
[52] U.S. Cl. ...................................... 357/43; 357/15; 357/42
[58] Field of Search .............................. 357/42, 43, 15

[56] References Cited

U.S. PATENT DOCUMENTS

| | | | |
|---|---|---|---|
| 4,336,550 | 6/1982 | Medwin | 357/15 |
| 4,694,562 | 9/1987 | Iwasaki et al. | 357/43 |
| 4,830,973 | 5/1989 | Mastroianni | 357/43 |
| 4,920,399 | 4/1990 | Hall | 357/42 |
| 4,928,164 | 5/1990 | Tanizawa | 357/43 |

FOREIGN PATENT DOCUMENTS

| | | | |
|---|---|---|---|
| 60-62150 | 4/1985 | Japan | 357/43 |
| 61-163651 | 7/1986 | Japan | 357/43 |
| 63-179559 | 7/1988 | Japan | 357/43 |
| 63-244767 | 10/1988 | Japan | 357/43 |

Primary Examiner—William Mintel
Assistant Examiner—Steven Loke
Attorney, Agent, or Firm—Townsend and Townsend

[57] ABSTRACT

Disclosed is an integrated transistor structure having increased conductance and operating speed including a complementary insulated gate field-effect transistor pair, each transistor including a source region and drain region with a gate contact positioned therebetween, ohmic contacts to the source and drain regions, and a diode junction contact to each of the drain regions. The gates of the two transistors are interconnected and function as the input terminal, and the two diode junction contacts are interconnected as the output of the device. The operation of the device is such that the lightly-doped drain regions act as bases of bipolar transistors, with the emitters formed by the p-n junction diodes. The transconductors of the MOS transistors is multiplied by the beta of the bipolar transistors. The ohmic contacts to the drain regions can be interconnected, and the low on resistance of the opposite polarity drive transistor extracts any excess stored charge in the drain region. Two clocked transistors interconnect the complementary insulated gate field-effect transistor pair to voltage potentials whereby operation of the integrated transistor structure is clocked.

10 Claims, 1 Drawing Sheet

CLOCKED CBICMOS INTEGRATED TRANSISTOR STRUCTURE

BACKGROUND OF THE INVENTION

This application is related to copending application Ser. No. 07/528,950 filed May 25, 1990 now U.S. Pat. No. 5,021,858 for Conductance-Modulated Integrated Transistor Structure and applicant's co-pending U.S. patent application Ser. No. 07/500,227, to be issued as a U.S. Patent, filed on Mar. 27, 1990 for "Compound Modulated Integrated Transistor Structure," a continuation of U.S. patent application Ser. No. 07/053,303 May 22, 1987 now abandoned.

This invention relates generally to high speed logic elements, and more particularly the invention relates to high speed complementary bipolar complementary MOS (CBiCMOS) integrated circuits including complementary Schottky bipolar CMOS integrated circuits.

My issued U.S. Pat. No. 4,920,399 and my copending application Ser. No. 07/528,950, supra, disclose the use of CBiCMOS technology in constructing high speed logic elements. Simple CMOS logic inverters are described in which speed of operation is increased by merging complementary bipolar transistors in the CMOS devices. More particularly, in the patented embodiment Schottky contacts are made to the drains of the CMOS transistors and the Schottky p-n junctions become emitter-base junctions of the bipolar transistors. The Schottky contacts are interconnected to form the output of the inverter. Majority and minority carriers injected by the diodes modulate the channel regions of the MOS transistors, thereby lowering their resistivity and increasing the transconductance of the device without increasing the physical size or the capacitance of the device and thereby improving the speed of the device. My copending application replaces the Schottky contacts with doped junction contacts. Additionally, ohmic contacts are made to the drain regions, and by interconnection of the ohmic contacts the low on resistance of the opposite polarity drive transistor extracts any excess stored charge in the drain region.

The present invention is directed to a clocked operating high speed inverter similar in structure to the device disclosed in my copending application.

SUMMARY OF THE INVENTION

An object of the invention is an improved high speed synchronous inverter.

Another object of the invention is an insulated gate compound transistor structure using modulated conduction to increase operating speed.

Still another object of the invention is a clocked CBiCMOS transistor structure in which the transconductance of the CMOS transistors is multiplied by the beta of the bipolar transistors.

A feature of the invention is the use of clocked transistors in series with a complementary MOS transistor pair which drive a complementary bipolar transistor pair with all devices being fabricated as an integrated structure.

Briefly, in one embodiment of the invention a CMOS transistor pair is fabricated in the surface of a lightly-doped (on the order of $10^{12}$ atoms per cubic centimeter) semiconductor body such as an epitaxial layer formed on a supporting substrate. The drain region of each transistor is lightly doped (on the order of $10^{16}$ atoms per cubic centimeter) and a junction diode contact is made thereto adjacent the drain contact. The resistivity of the drain region is sufficiently high to allow formation of an emitter electrode contact to the drain region by a more heavily doped region or by Schottky contact. The common gate terminals function as the device input, and the common injecting electrodes function as the device output.

Additionally, two MOS transistors serially connect the source regions of the CMOS transistor pair to voltage potentials with the gate of the two MOS transistors connected to clock signals. Thus, power is clocked to the CMOS transistor pair.

In operation, the drains of the transistors form the bases of bipolar transistors with the injecting diodes functioning as emitter followers. The diodes inject minority carriers when the MOS gates are turned on and cause a significant reduction in output resistance. The use of an auxiliary p-n junction injector in conjunction with each transistor of a complementary MOS transistor pair overcomes the problem of slow switching i speed observed in the application of the p-n junction minority carrier injector to the DMOS transistor. A p-n junction is formed within the drain area of each of the p-channel transistor and the n-channel transistor forming a complementary bipolar transistor output stage formed in conjunction with the complementary MOS input. A drain contact of the transistor can be formed in the usual way, but is electrically connected only to the drain contact of the opposite polarity transistor. The diode junction emitter of the p-channel MOS transistor is electrically connected to the diode junction emitter of the n-channel transistor through a metal interconnect and forms the output terminal of the device. The gate electrodes of the MOS transistors are connected and form the inverter input. In this configuration the drains of the MOS transistors form the base of each of two complementary (emitter followers) auxiliary emitter bipolar transistors. The diode junction (formed completely within the drain area and spaced the required base width from the bottom of the drain p-n junction) is of higher carrier concentration than the drain and forms the emitter of the bipolar transistor. The collector of the bipolar transistor is formed by a buried layer underneath the MOS transistor, which is of the opposite polarity to the drain and is connected to the appropriate power terminal. The bi-directional base currents of this pair of complementary bipolar transistors are supplied via the channels of the respective MOS transistors when their gates are turned on and off, and increasing switching speed is provided by rapid removal of any excess charge in the bipolar transistors.

The invention and objects and features thereof will be more readily apparent from the following detailed description and appended claims when taken with the drawing.

DETAILED DESCRIPTION OF ILLUSTRATIVE EMBODIMENTS

Figures 1, 2:
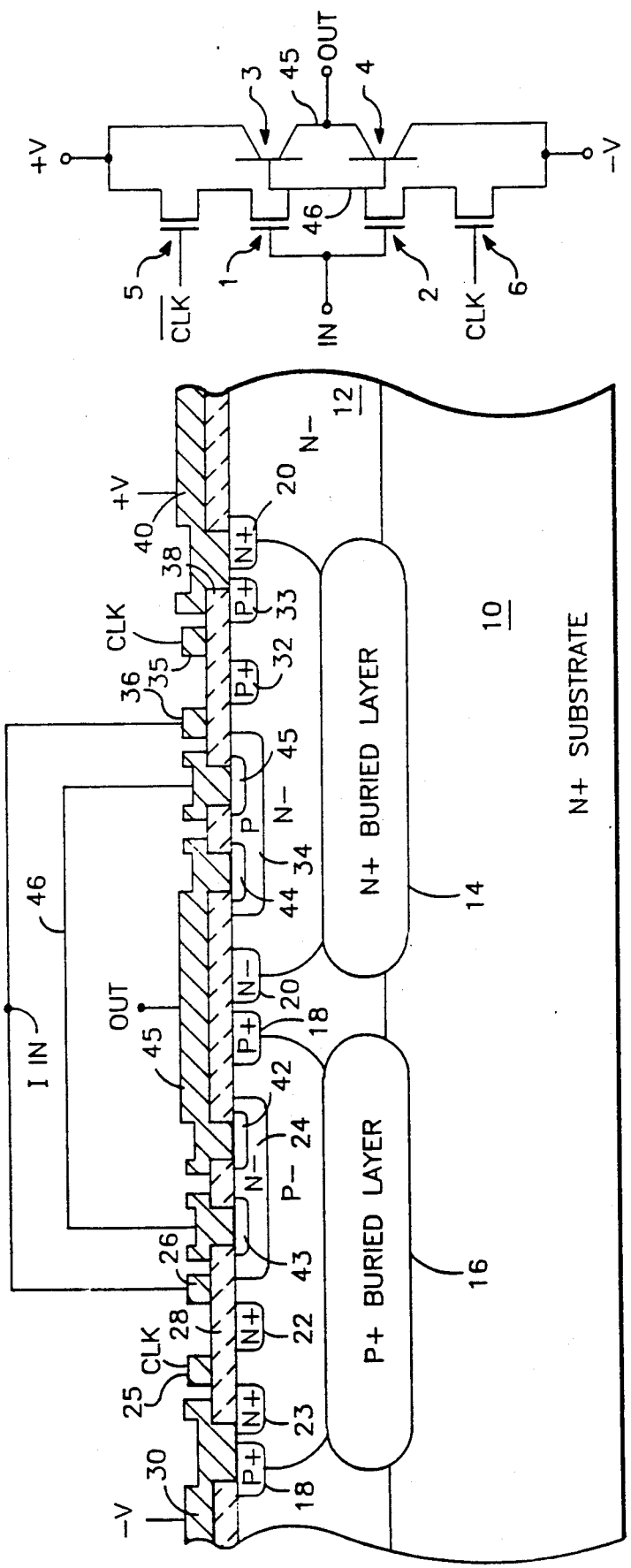
FIG. 1 is a schematic diagram of an integrated transistor structure in accordance with the invention.
FIG. 2 is a section view of the complementary MOS transistor pair of FIG. 1.

Referring now to the drawing, FIG. 1 is an electrical schematic of a clocked CBiCMOS circuit in accordance with one embodiment of the invention. A cmos transistor pair including p-channel transistor 1 and n-channel transistor 2 are interconnected with the bases of a complementary bipolar transistor pair including NPN transistor 3 and PNP transistor 4. The collectors of transistors 3, 4 are respectively connected to a +V potential and to a −V potential. Ground can be used for either voltage potential so long as the potential applied to the collector of transistor 3 is higher than the potential applied to the collector of transistor 4.

In accordance with a feature of the invention, a p-channel transistor 5 serially connects the source of transistor 1 to the +V potential, and an n-channel transistor 6 serially connects the source of transistor 2 to the −V potential. The gates of transistors 5 and 6 are connected to clock signals (CLK, $\overline{CLK}$) whereby conductance of transistors 5, 6 and operation of the circuit is synchronized to the clock signal.

FIG. 2 is a section view illustrating the integrated transistor structure of FIG. 1. In this embodiment, an n+ substrate 10 has an n epitaxial layer 12 formed thereon. The dopant concentration of the epitaxial layer is very light, on the order of $10^{12}$ atoms per cubic centimeter. An N+ buried layer 14 and a P+ buried layer 16 are provided at the interface of the epitaxial layer 12 and substrate 10. Conventionally, the buried layer is formed by highly doped surface regions of the substrate 10 prior to the epitaxial growth of layer 12. The portion of the N− epitaxial layer 12 above the P+ buried layer 16 is converted to P− conductivity by ion implantation. P+ regions 18 are formed at the surface of epitaxial layer 12 and define a device region above the P+ buried layer 16, and n+ regions 20 are formed in the surface of the epitaxial layer 12 of the N+ buried layer region 14 and define a second device region.

An n-channel insulated-gate transistor is formed in the first device region with an N+ source region 22 formed in the surface and a lighter-doped N− region 24 (e.g. $10^{16}$ atoms/cc) spaced from the N− region 22 and defining the drain region. A gate contact 26 is formed over an insulated layer 28 between the source 22 and drain 24.

Similarly, a p-channel insulated-gate transistor is fabricated in the second device region above the N+ buried layer 14 with a P+ region 32 forming the source and a lighter-doped P− region 34 (e.g. $10^{16}$ atoms/cc) forming the drain. A gate contact 36 is formed over an insulating layer 38 between the source 32 and drain 34.

Diffused regions 42 and 44 are made in the N-drain 24 and to the P− drain 34, respectively, of the two transistors. The regions 42 (p-type conductivity) and 44 n-type conductivity) function as emitters and form junction diodes with the drain regions, and the drain regions function as base regions in complementary bipolar transistors. Metal layer 45 interconnects region 42 and 44 and functions as the output of the circuit. In this embodiment, ohmic contacts 43 (n-type conductivity) and 45 (p-type conductivity) are made to the base regions 24 and 34 which are interconnected by a conductor 46, however, the conductor 46 can be eliminated. The buried regions 14 and 16 form the collectors of the bipolar transistors.

In accordance with a feature of the invention, a P+ region 33 cooperatively functions with P+ region 32 as the p-channel transistor 5 interconnecting the +V potential to transistor 1 comprising the p-channel insulated-gate transistor in the second device region. A gate 35 receives a $\overline{CLK}$ signal. Similarly, an N+ region 23 cooperatively functions with N+ region 22 as the N-channel transistor 6 interconnecting the −V potential to transistor 2 comprising the n-channel insulated gate transistor in the first device region. A gate 25 receives a CLK signal.

There has been described an integrated transistor logic device in which use of auxiliary p-n junction injectors in conjunction with each transistor of a complementary MOS transistor pair overcomes the problem of slow switching speed. The use of series insulated gate field effect transistors for interconnecting voltage potentials to the complementary MOS transistor pair allows clocked operations of the circuit. While the invention has been described with reference to a specific embodiment, the description is illustrative of the invention and is not to be construed as limiting the invention. For example, the junction diode emitters can be replaced by Schottky diode emitters. Thus, various modifications and applications may occur to those skilled in the art without departing from the true spirit and scope of the invention as defined by the appended claims.

I claim:

1. A clocked high speed integrated transistor structure comprising a semiconductor body having a major surface with a first device region of a first conductivity type and a second device region of a second conductivity type therein, a first device formed in said first device region and including a source region and a drain region of said second conductivity type, said source and drain regions being spaced apart by a first channel region, a gate contact between said source and drain regions and insulatively spaced from said first channel region, and first means forming a rectifying junction with said drain region, a second device formed in said first device region and including a source region and a drain region of said second conductivity type, said source region and said drain region of said second device being spaced apart by a second channel region, a gate contact between said source and drain regions of said second device and insulatively spaced from said second channel region of said second device, an ohmic contact to said source region of said second device for receiving a negative voltage potential, said drain region of said second device being interconnected with said source region of said first device and a clock signal connected to said gate contact of said second device, a third device formed in said second device region and including a source region and a drain region of said first conductivity type, said source and drain regions of said third device being spaced apart by a third channel region, a gate contact between said source and drain regions of said third device and insulatively spaced from said third channel region, and second means forming a rectifying junction with said drain of said third device, a fourth device formed in said second device region and including a source region and a drain region of said first conductivity type, said source and drain regions of said fourth device being spaced apart by a fourth channel region, a gate contact between said source and drain regions of said fourth device and insulatively spaced from said fourth channel region, an ohmic contact to said source region of said fourth device for receiving a positive voltage potential, said drain region of said fourth device being interconnected with said source region of said third device, and a clock signal connected to said gate contact of said fourth device, input connector means interconnecting said gate of said first device and said gate of said third device, and output connector means interconnecting said first means of said first device and said second means of said third device.

2. The integrated transistor structure as defined by claim 1 wherein said first means and said second means are doped regions in said drain regions of said first and third devices.

3. The integrated transistor structure as defined by claim 2 wherein said semiconductor body comprises a semiconductor substrate and an epitaxial layer formed on a surface of said substrate.

4. The integrated transistor structure as defined by claim 3 wherein said first device region further includes a first buried layer of said first conductivity type, and said second device region further includes a second buried layer of said second conductivity type.

5. The integrated transistor structure as defined by claim 4 wherein dopant concentration in said drain regions of said first and third devices is sufficiently low to permit doped p-n junction contacts thereto.

6. The integrated transistor structure as defined by claim 5 wherein said source region of said first device is integral with said drain region of said second device, and said source region of said third device is integral with said drain region of said fourth device.

7. The integrated transistor structure as defined by claim 6 and further including an ohmic contact to said drain region of said first device, an ohmic contact to said drain region of said third device, and means interconnecting said ohmic contacts to said drain regions of said first device and said third device.

8. The integrated transistor structure as defined by claim 1 and further including an ohmic contact to said drain region of said first device, an ohmic contact to said drain region of said third device, and means interconnecting said ohmic contacts to said drain regions of said first device and said third device.

9. The integrated transistor structure as defined by claim 8 wherein said source region of said first device is integral with said drain region of said second device, and said source region of said third device is integral with said drain region of said fourth device.

10. The integrated transistor structure as defined by claim 1 wherein said source region of said first device is integral with said drain region of said second device, and said source region of said third device is integral with said drain region of said fourth device.

* * * * *